United States Patent
Fukui

(10) Patent No.: US 6,627,900 B2
(45) Date of Patent: Sep. 30, 2003

(54) METHODS, BASED ON A GENETIC ALGORITHM, FOR CONFIGURING PARAMETERS OF AN ARRAY OF MULTIPLE COMPONENTS FOR COOPERATIVE OPERATION TO ACHIEVE A DESIRED PERFORMANCE RESULT

(75) Inventor: Saori Fukui, Kawasaki (JP)

(73) Assignee: Nikon Corporation, Tokyo (JP)

(*) Notice: Subject to any disclaimer, the term of this patent is extended or adjusted under 35 U.S.C. 154(b) by 134 days.

(21) Appl. No.: 09/785,943

(22) Filed: Feb. 16, 2001

(65) Prior Publication Data

US 2001/0030289 A1 Oct. 18, 2001

(30) Foreign Application Priority Data

Feb. 18, 2000 (JP) .......................... 2000-041517
Mar. 23, 2000 (JP) .......................... 2000-082637

(51) Int. Cl.[7] .......................... H01J 37/08; G21G 5/00; G21K 5/00; G06N 3/12
(52) U.S. Cl. .......................... 250/396 R; 250/396 MR; 250/492.2; 250/492.22; 250/492.23; 706/13
(58) Field of Search .......................... 250/492.22, 492.23, 250/400; 706/13

(56) References Cited

U.S. PATENT DOCUMENTS

| | | | | | |
|---|---|---|---|---|---|
| 3,829,750 | A | * | 8/1974 | Centner et al. .......... | 318/561 |
| 5,581,657 | A | * | 12/1996 | Lyon .......... | 706/13 |
| 5,651,099 | A | * | 7/1997 | Konsella .......... | 706/13 |
| 5,698,859 | A | | 12/1997 | Haruki | |
| 5,864,633 | A | * | 1/1999 | Opsal et al. .......... | 382/141 |
| 5,886,902 | A | * | 3/1999 | Turrini .......... | 703/2 |
| 5,897,629 | A | * | 4/1999 | Shinagawa et al. .......... | 706/13 |
| 6,063,292 | A | * | 5/2000 | Leung .......... | 210/739 |
| 6,085,183 | A | * | 7/2000 | Horn et al. .......... | 706/45 |
| 6,086,617 | A | * | 7/2000 | Waldon et al. .......... | 703/2 |
| 6,140,660 | A | * | 10/2000 | Mermelstein .......... | 250/550 |
| 6,182,057 | B1 | * | 1/2001 | Kikuchi et al. .......... | 706/13 |
| 6,236,894 | B1 | * | 5/2001 | Stoisits et al. .......... | 700/28 |
| 6,328,897 | B1 | * | 12/2001 | Leung .......... | 210/744 |
| 6,411,871 | B1 | * | 6/2002 | Lin .......... | 701/27 |
| 6,412,100 | B1 | * | 6/2002 | Sasagawa et al. .......... | 716/9 |
| 6,418,398 | B1 | * | 7/2002 | Dueck et al. .......... | 702/181 |
| 2002/0101581 | A1 | * | 8/2002 | Murakawa et al. .......... | 356/138 |

OTHER PUBLICATIONS

Chu et al., "Numerical Analysis of electron beam lithography systems: Part IV: Computerized optimization of the electron performance of electron beam lithography systems using the damped least squares method," *Optik* 61(3):213–236 (1982).

* cited by examiner

Primary Examiner—John R. Lee
Assistant Examiner—Bernard Souw
(74) Attorney, Agent, or Firm—Klarquist Sparkman LLP

(57) ABSTRACT

Methods are disclosed for determining respective values of system parameters of, e.g., a charged-particle-beam (CPB) optical system of a CPB microlithography apparatus. The methods, based on a genetic algorithm, yield optimal combinations of the values without converging to local, rather than optimal, solutions. In an example involving six deflectors energized with respective current ratios and producing respective magnetic fields, respective values of each parameter are represented as respective genes (total=12 genes). Each parameter combination is a respective species having a chromosome containing the 12 genes. From an initial group of species having random genes as initial values, a specified number of species having high evaluation values are selected. Species having recombined chromosomes are produced by crossing selected "parents," and a specified number of "children" having higher evaluation values are selected for further matings. Repeated matings and weighting of offspring yield an individual having an optimal evaluation value.

18 Claims, 3 Drawing Sheets

| $I_j(1)$ | $\theta_j(1)$ | $I_j(2)$ | $\theta_j(2)$ | $I_j(3)$ | $\theta_j(3)$ | $I_j(4)$ | $\theta_j(4)$ | $I_j(5)$ | $\theta_j(5)$ | $I_j(6)$ | $\theta_j(6)$ |

«METHODS, BASED ON A GENETIC ALGORITHM, FOR CONFIGURING PARAMETERS OF AN ARRAY OF MULTIPLE COMPONENTS FOR COOPERATIVE OPERATION TO ACHIEVE A DESIRED PERFORMANCE RESULT»

FIELD OF THE INVENTION

This invention pertains generally to arrays of components, such as an array of deflectors as used in a charged-particle-beam (CPB) optical system, that function cooperatively to achieve a desired performance of the system comprising the components. The invention also pertains to methods for exploring a "design space" to find an optimal combination of respective values of configurational and/or operational parameters of the components to achieve the desired performance. Such methods are especially useful in CPB microlithography systems that comprise one or more arrays of multiple deflectors. The deflectors must function cooperatively with each other to produce a desired imaging quality. For example, individual respective values of configurational and/or operational parameters for each deflector must be optimized in view of the parameters of the other deflectors to produce a combination of values of the parameters achieving the desired imaging quality.

BACKGROUND OF THE INVENTION

In view of the resolution limits of optical microlithography (microlithography performed using a light beam such as a beam of ultraviolet light), charged-particle-beam (CPB) microlithography has received considerable attention as a possible successor technology. The reasons are similar to the argument that electron microscopy achieves greater resolution than optical microscopy.

Examples of conventional CPB microlithography include (a) spot-beam exposure systems, (b) variable-shaped-beam exposure systems, and (c) block exposure systems. Each of these exposure systems offer prospects of much greater resolution than so-called "one-shot" optical microlithography systems, but are grossly inferior in terms of throughput. Specifically, in exposure systems (a) and (b), throughput is low because exposure is accomplished by tracing the pattern using a beam having an extremely small round or square spot diameter, respectively. It is immediately apparent that a complex pattern requires a large amount of time to "draw" line-by-line. Exposure system (c) was developed to achieve improved throughput over systems (a) and (b). In exposure system (c), throughput is improved because the pattern includes an array containing a large number (typically thousands) of individual repeat units, such as the memory cells on a memory chip. The repeat unit normally is very small, typically about 5 $\mu$m square on the substrate. The repeat unit is defined on a reticle and is exposed over and over again within a region on the substrate corresponding to the chip. As readily understood, considerable time is required to expose the array in each chip, which results in low throughput. Also, this technique is not used to transfer non-repeated portions of the chip pattern. Instead, the non-repeated portions usually are exposed by direct writing using a variable-shaped beam. This need to exploit multiple different techniques to expose each chip further compromises throughput. As a result, system (c) does not provide the throughput required for mass-production wafer fabrication.

A technique offering prospects of substantially greater throughput than the techniques summarized above involves exposing, in a single "shot," a reticle defining the entire pattern to be transferred to a chip or defining a pattern for multiple chips. The reticle is exposed with "demagnification," by which is meant that the reticle image is smaller (usually by an integer factor termed a "demagnification factor") than the corresponding pattern as defined on the reticle. Whereas the throughput potentially achievable using this technique is at least as good as currently achievable using optical microlithography, this technique unfortunately has several serious problems. One problem is the current impossibility of fabricating a reticle configured to be exposed in a single shot of a charged particle beam. Another problem is the current impossibility of adequately correcting off-axis aberrations, especially in peripheral regions of the large image produced by the charged particle beam.

A more recently considered approach is termed "divided-reticle" pattern transfer, which involves dividing the pattern, as defined on the reticle, into multiple individual exposure units usually termed "subfields." Each subfield is exposed individually onto a respective region on the wafer. The subfield images are transferred to the wafer so that, after exposing all the subfields, the subfield images are "stitched" together in a contiguous manner to form the entire chip pattern. Divided-reticle pattern transfer allows exposures to be made over an optically wide field with much better resolution and accuracy than could be obtained by exposing the entire reticle in one shot. Although divided-reticle pattern transfer does not yet achieve the same throughput as optical microlithography, the throughput nevertheless is much better than obtainable using the other CPB microlithography techniques summarized above.

Certain aspects of divided-reticle pattern transfer are shown in FIGS. 5 and 6. FIG. 5 depicts a wafer on which multiple chips have been exposed. As exposed, each chip comprises multiple "stripes," and each stripe comprises multiple subfields arranged in rows. This same divided arrangement of stripes and subfields is used to define the pattern on the reticle. FIG. 6 depicts an actual exposure. For exposure, the reticle and wafer are mounted on respective stages (not shown but well understood in the art) configured to move the reticle and wafer horizontally (in the figure) as required for exposure. During exposure of a stripe (a portion of which is shown), the reticle stage and wafer stage both move along the longitudinal line of the respective stripes. Movements of the reticle and wafer are at constant respective velocities (but in opposite directions) in accordance with the demagnification ratio. Meanwhile, the charged particle beam incident on the reticle (the beam incident on the reticle is termed the "illumination beam" and passes through an "illumination-optical system" to the reticle) illuminates the subfields on the reticle row-by-row and subfield-by-subfield within each row (the rows extend perpendicularly to the movement directions of the reticle and wafer). As each subfield is illuminated in this manner, the portion of the illumination beam passing through the respective subfield (now termed the "patterned beam" or "imaging beam") passes through a projection-optical system to the wafer.

During exposure of a stripe, to expose the rows and subfields within each row of the stripe in a sequential manner, the illumination beam is deflected at right angles to the movement direction of the reticle stage and the patterned beam is deflected at right angles to the movement direction of the wafer stage. After completing exposure of each row, the illumination beam is deflected in the opposite direction, as shown in FIG. 6, to expose the subfields in the next row of the stripe. This exposure technique reduces extraneous deflections of the beam and improves throughput.

Normally, on the reticle, each subfield is surrounded by "struts" configured as a lattice separating the subfields from one another and providing the reticle with considerable rigidity and mechanical strength. The struts also ensure that, in each shot, only the respective subfield is illuminated and exposed onto the wafer.

In a divided-reticle CPB projection-microlithography apparatus, throughput is improved by performing exposures using a relatively high beam current in the illumination-optical system and projection-optical system. To perform exposures with a high beam current, it usually is necessary to enlarge the area of the reticle being exposed per shot, and to accelerate the beam with a high beam-acceleration voltage, so as to reduce image blur due to the Coulomb effect.

Throughput also can be increased by performing exposures at the widest practical range of beam deflection. Enlarging the deflection field in this manner results in a corresponding increase in the width of the stripes, which decreases the amount of time that must be dedicated to mechanically shifting positions of the wafer and reticle. Enlarging the deflection field also reduces the number of times that scanning of the beam must reverse direction (FIG. 6). As a result, the time overhead consumed in starting and stopping motions of the stages and the beam is reduced throughput correspondingly increased. Unfortunately, imparting wider deflections of the beam results in the beam passing through areas of the reticle that are far off the axis of the illumination-optical and projection-optical systems, causing substantial deflection aberrations. To reduce these aberrations substantially, deflectors are provided in the illumination-optical and projection-optical systems. The deflectors are energized individually in a controlled manner to deflect the beam as required to correct the particular aberrations for each subfield.

In view of the number of deflectors required and the need to energize each deflector in a different manner from one another in each subfield and from one subfield to the next, it is difficult to obtain an optimum combination of deflector-energization parameters for each subfield. Software programs currently are available for determining parameters and achieving a certain level of deflector control. However, the current algorithms developed for that software exhibit only a limited extent and quality of performance, resulting in a falling apart of local solutions and the existence of situations in which proper solutions are not obtainable. Furthermore, current software for deflector control requires extensive experience and training to set up and use.

SUMMARY OF THE INVENTION

In view of the shortcomings of conventional methods and apparatus as summarized above, an object of the invention is to provide methods for configuring and/or operating multiple components that must function cooperatively to achieve a desired performance result. For example, the methods can be applied to configuring and/or operating an array of multiple deflectors in a charged-particle-beam (CPB) optical system or a CPB projection-microlithography apparatus including such an optical system, so as to produce, for each subfield to be exposed, an optimal combination of exposure parameters, while avoiding the convergence to a local solution rather than an optimal solution.

To such ends, and according to a first aspect of the invention, methods are provided in the context of a CPB optical system comprising multiple components each having at least one parameter the value of which is established so as to cause, when all such components of the CPB optical system are configured or operated in a coordinated manner according to the respective values of the parameters, the CPB optical system to operate in a manner producing a desired performance result. The methods allow determinations of respective values of the parameters for the components. According to an embodiment of such a method, and according to the analysis model employed in the method, each respective value of a respective parameter is regarded as a respective "gene." Each respective combination of values of the parameters is regarded as a respective "chromosome" and each respective configuration of the CPB optical system according to the respective chromosome is regarded as a respective "species." To begin execution of the method, each parameter has a respective initial condition gene, wherein each of $N_A$ species in a group "A" comprises a respective chromosome of the initial condition genes. An evaluation function is defined, wherein values of the evaluation function are related to respective qualities of a performance characteristic of the CPB optical system. A threshold value is established for the evaluation function. From the group-A species, a group "B" including $N_B$ species (wherein $N_B \leq N_A$) is selected in which each constituent species has a high respective value of the evaluation function. From the group-B species, groups "$C_{ND}$" (in which each group includes $N_C$ individuals) are selected to produce a group "D" including $N_D$ species. Each species in group D comprises a respective chromosome produced by recombination of one or more genes from respective chromosomes of species in the groups $C_{ND}$. The group D of $N_D$ species is produced from the $N_C$ individuals. From the group D, a new group B including $N_B$ species is selected. The steps of selecting the group B through producing a species of group D are repeated a predetermined number of times or until a species is produced in group D having a respective value of the evaluation function that exceeds the threshold. Finally, the species produced in the previous step is employed to define the respective combination of values of the parameters for configuring the components or for operating the components in the coordinated manner.

A "species" as the term is used above is a distinctive combination of respective values for the subject parameters for all the subject components. Each respective value of a subject parameter is termed a "gene." For example, if the subject components are six deflectors as arrayed in a CPB optical system, and each deflector has associated therewith respective values of two different parameters, then each species is represented by a distinctive combination of 12 genes. For any species, the array of genes can be represented as a "chromosome" containing the gene sequence of the particular species. Hence, species having identical gene sequences are identical species, and species in which even one gene is different are different species from one another.

An "individual" as used herein is a unit having a gene sequence that is the same as the gene sequence of its affiliated species.

In this embodiment of the subject methods, a genetic algorithm is employed to find, for the array of components, an optimal species, i.e., an optimal combination of configurational and/or operational parameters, thereby providing an optimal performance of the system. An evaluation function is employed. From among a certain number of species, the species that are selected have higher respective values of the evaluation function than species that are not selected. From the group of selected species, individuals are selected to be "parents," according to a specified rule (e.g., selection criterion or probability). Among the parents, multiple "matings" are performed. In each "mating," multiple parents produce a "child" species of which the chromosome typically contains respective genes from each of the parents. In other words, in each mating, the genes from the parents are "crossed" or "recombined" to produce a new combination of genes in the child. Among the "children," species are selected having "higher" respective values of the evaluation function than species that are not selected. Among the selected children species, individuals are selected according to a specified rule to serve as a second generation of parents. Children ("grandchildren") with crossed genes are produced from respective matings of this second generation of parents. This process of selecting parents and performing matings is repeated as required to produce a progeny species having an optimal value of the evaluation function.

In the "matings," as noted above, parental genes are "crossed," resulting in some or all the parental genes being mixed (recombined) in the resulting child. Hence, it is possible to evaluate a wide range of species and avoid convergence on a local solution (rather than an optimal solution). Also, since species having higher respective values of the evaluation function are carried forward as candidate parents to be mated to produce the subsequent generation, there is a high probability that the children resulting from that mating will have even higher respective values of the evaluation function, thereby facilitating the finding of an optimal solution.

The phrase "mixing or exchanging at least some of the genes from chromosomes" in any of the stated groups indicates that one or both mixing and exchanging (generally termed "recombination") can be performed. This phrase also includes situations in which one is performed in a first subset of chromosomes, the other is performed in a second subset of chromosomes, and both are performed in a third subset of chromosomes.

Instances may arise in which several species in the D group unintentionally have the same chromosomes. In such instances, the same-chromosome species nevertheless are regarded as different species.

By way of example, recombination of genes occurs between a "male" parent and a "female" parent (these terms are used for convenience in this specification). Since, in the subject methods, there is no actual distinction between male and female, it will be understood that gene mixing and/or exchange (recombination) can occur between two individuals. Alternatively, gene recombination also can occur between three or more individuals. To illustrate, an exchange of genes between three individuals a, b, c can be performed in sequence, wherein some of a's genes are moved into b's chromosome, some of b's genes are moved into c's chromosome, and some of c's genes are moved into a's chromosome. Recombination of genes between three or more individuals typically consists of substituting the various genes for corresponding genes in the three or more individuals, according to a calculation formula serving as an independent variable.

Species having higher respective values of the evaluation function are carried forward. Alternatively, the evaluation function can be formulated such that species having "lower" respective values thereof desirably are selected to be carried forward. Such an alternative situation is self-evident, and both situations are clearly equivalent and encompassed by the invention.

In this embodiment of the method, in the various steps that are repeated, the respective numbers of species $N_B$, $N_C$ in the B and $C_{ND}$ groups can be changed in each repeat.

In the description below, the term "reticle" is used. However, "reticle" often is used interchangeably with "mask," and these terms are synonymous herein.

Furthermore, in the descriptions herein, the subject components (e.g., of a CPB optical system) are not construed necessarily to indicate all of the components, but rather typically refer to those components for which optimum parameters are to be determined. In addition, among the components of a system such as CPB optical system, the components for which optimum parameters are to be determined can be subdivided into several groups, wherein methods as described herein are used to determine respective optimum parameters for one or more of the groups of components. In such an instance, if no interference exists between the respective parameters of one group and the respective parameters of another group, then the number of combinations can be minimized and optimization can be simplified by determining the optimum parameters for respective components of the various groups as a whole. Viewed from a different perspective, the concept of evaluating separate groups of respective components corresponds with analyzing the genes of multiple chromosomes, wherein each chromosome corresponds to a respective group of components and the genes of each chromosome correspond to the components in the respective group.

In the step of selecting the group-$C_{ND}$ individuals from the group-B species, the groups $C_{ND}$ are selected in a manner such that species having high respective values of the evaluation function have a high probability of being selected. Hence, the probability is increased that species having high respective values of the evaluation function will be crossed with each other, thereby increasing the probability that subsequent generations will include species having even higher respective values. The respective probability can be expressed as a ratio of the respective value of the evaluation function to a sum of respective values of the evaluation function among the group B of species. Thus, it is easier to select species, having high respective values of the evaluation function, as high-priority parents.

The method can include the step of substituting a specified number $N_E$ (wherein $N_E<N_D$) of species, having low respective values of the evaluation function, in the group D with the specified number $N_E$ of species, having high respective values of the evaluation function, in the group B. When new genes are obtained by recombining genes from parents, it is possible that a child will have a lower respective value of the evaluation function than any of its parents. This is "degradation," which can be prevented by unconditionally carrying forward a predetermined number of parents in order, starting with the parent having the highest respective value of the evaluation function. If a specified number of parents are carried forward in this manner, then the number of children selected decreases by a corresponding amount.

The method can include the step of forming a group (D+F) of species by adding a specified number $N_F$ of species, having high respective values of the evaluation function, in the group B to the species in group D, wherein the (D+F) group is substituted for the group A. The basic concept of this scheme is the same as described in the previous paragraph. However, rather than decreasing the number of children species by the added number of parent species, a combination of the two is utilized as the new parent species. The effect is the same as described in the previous paragraph.

In the step of selecting the groups $C_{ND}$ of individuals to produce a group D of species, the genes can be recombined according to a weighted average of respective values, of the evaluation function, of the genes. In this scheme, since the genes of individuals destined to be parents will become the genes of the respective child by weighting the genes by their respective values of the evaluation function and rendering a weighted average, the effects of the genes (parameters) having the higher respective values of the evaluation function can be carried forward substantially, thereby increasing the probability of creating species having high respective values of the evaluation function.

The step of selecting the groups $C_{ND}$ of individuals to produce a group D of species can include changing the genes in the respective chromosomes of at least some of the species in group D by respective specified values, respective specified values randomly selected from a group of values within a specified range, or to respective values randomly selected from a group of values within a specified range. This variation allows for the testing of "mutations," wherein species having respective chromosomes with greatly different characteristics are produced by changing ("mutating") some or all of the genes of a species. The genes can be mutated by a specified value, by a value randomly selected from a group of values within a specified range, or to a value randomly selected from a group of values within a specified range. Thus, the search space is broadened and the probability of convergence to a local solution (rather than to an optimal solution) is minimized. However, randomly selected values desirably are limited to ranges considered in the design of the subject system to prevent combinations of parameters that are useless in the subject system.

The number of species that will be mutated can be reduced, before the mutation and after the recombination of genes, by excluding species having high respective values of the evaluation function. If, in the scheme summarized in the preceding paragraph, species having high respective values of the evaluation function are obtained before making mutations, these "high-value" species can be excluded from the mutation. Also, the "mutation" is selected from the remaining "low-value" species. After new chromosomes are created by recombining some or all of the parental genes or by changing some of the parental genes, the respective values of the evaluation function of the newly created species are found. This exclusion prevents changing the "high-value" species to "low-value" species by the mutation.

After the "repeat-steps" step of the method summarized above, a second evaluation function can be defined. Values of the second evaluation function can be related to respective qualities of a performance characteristic of the system. A threshold value for the second evaluation function is established. Then, the noted "repeat-steps" step is performed a predetermined number of times or until a species is produced in the group D having a respective value of the second evaluation function that exceeds the threshold for the second evaluation function. Whenever there are multiple target values in a system design, evaluation criteria can be set using different functions. As a result, individual target values need not be within requisite ranges even through the specified value of an evaluation function is obtained. In this scheme, multiple evaluation functions are employed, and a combination of "high-value" species is found by first repeatedly performing the noted steps using one of the evaluation functions. The resulting children then are used in repeatedly performed steps in which the other evaluation function is employed. The species derived at the end of all iterations is employed in the system. It is highly likely that this ultimate species meets all numerical parametric requirements.

The method can include the step of executing a hill-climbing technique on the determined respective values of at least some of the parameters to obtain a combination of respective values of the parameters having an optimal respective value of the evaluation function. In the methods and variations of the methods summarized above, a key characteristic is the introduction of randomness that serves to broaden the search space and to prevent the convergence to a local solution rather than to an optimal solution. However, basing a method on randomness can result in slow convergence, thereby increasing the probability that an optimal solution will not be found. Hence, searching can be performed until a nearly optimal solution is found, while avoiding convergence to a local solution rather than to an optimal solution. Afterward, the search can be continued by the "hill-climbing" method as described herein.

According to another aspect of the invention, CPB optical systems are provided that comprise multiple components of which respective parameters have respective values configured according to any of the methods summarized above. Since the parameters for the components constituting the CPB optical system thus are configured and/or operated optimum values of relevant parameters, distortion and blur are reduced, allowing patterns with ultra-fine linewidths to be exposed and transferred accurately.

According to another aspect of the invention, exemplary CPB optical systems are provided, exhibiting a number of favorable parametric qualities. For example, in an exemplary system, the angle of incidence of the beam to the reticle is $\leq 0.125$ mrad, blur is $\leq 1$ μm, and distortion in the subfields is $\leq 5$ μm. These parameters are all met under certain stated conditions and where the exit angle of the beam from the beam-shaping aperture of the system is $\leq 1$ mrad.

The foregoing and additional features and advantages of the invention will be more readily apparent from the following detailed description, which proceeds with reference to the accompanying drawings.

DETAILED DESCRIPTION

The invention is described below in the context of representative embodiments that are not intended to be limiting in any way. Also, the embodiments are described in the context of using an electron beam as the microlithographic energy beam. However, the principles of the invention can be applied with equal facility to the use of other types of charged particle beams, such as an ion beam. Also, although the embodiments are described in the context of a charged-particle-beam (CPB) microlithography apparatus, it will be understood that the principles of the invention can be applied also to CPB optical systems in general.

First Representative Embodiment

Figures 1, 2:
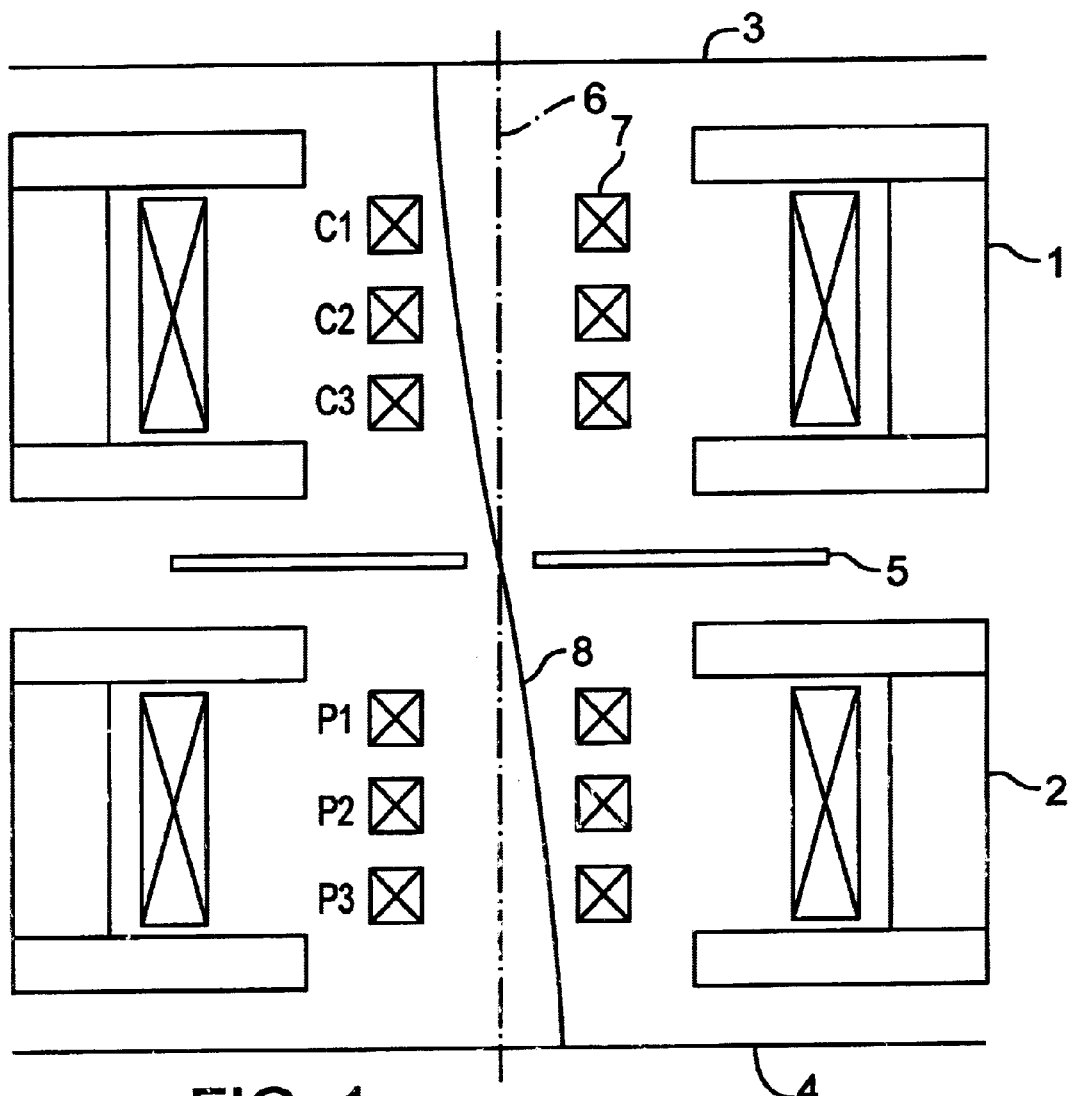
FIG. 1 is a schematic elevational depiction of a representative illumination-optical system of a charged-particle-beam (CPB) projection-microlithography apparatus according to the first representative embodiment.
FIG. 2 depicts an illumination system comprising six deflectors, represented as an individual.

Certain aspects of this embodiment are shown in FIG. 1, schematically depicting an exemplary illumination-optical system of an electron-beam projection-microlithography apparatus. Situated along an optical axis 6 are first and second lenses 1, 2, respectively, a beam-shaping aperture 3, a reticle 4, an aperture 5, and a deflector assembly 7. The trajectory of the electron beam (from an upstream source) is denoted by the line 8.

The electron beam is trimmed by the beam-shaping aperture 3 to a transverse size and shape suitable for illuminating a single subfield on the reticle 4. For illumination, the beam is focused on the reticle 4 by the lenses 1, 2. The deflector assembly 7 comprises three deflectors $C_1$, $C_2$, $C_3$ associated with the first lens 1 (and situated upstream of the aperture 5), and three deflectors $P_1$, $P_2$, $P_3$ associated with the second lens 2 (and situated downstream of the aperture 5). The deflectors $C_1$–$C_3$ and $P_1$–$P_3$ deflect the beam, exiting the beam-shaping aperture 3, as required to cause the beam to propagate along the proper trajectory 8, pass through the aperture 5, and form an "image" at the desired location (i.e., subfield location) on the reticle 4, while eliminating distortion and aberrations of the "image."

Although FIG. 1 depicts an exemplary system comprising two lenses and six deflectors configured as shown, it will be understood, however, that alternative systems can have any of various other configurations. For example, the subject system can have a different number of deflectors in the C group and/or in the P group.

In the following analysis, with respect to each of the deflectors $C_1$–$C_3$, $P_1$–$P_3$, each respective current ratio and each respective deflector angle is regarded as an individual "gene." (More generally, a "gene" can be a particular value of any parameter affecting system performance.) Each respective current ratio is expressed with the current applied to the first deflector C1 regarded as unity. Also, the respective deflector angles are the respective angular orientations of the magnetic field formed by the deflectors, wherein the positive direction along the X-axis is regarded as 0°, and the positive direction along the Y-axis is regarded as 90°.

In the combination of deflectors $C_1$–$C_3$ and $P_1$–$P_3$, each deflector can have a particular current ratio and deflector angle independently of the respective current ratios and deflector angles of the other deflectors. Hence, in a population of deflector combinations $C_1$–$C_3$ and $P_1$–$P_3$, many different combinations of current ratios and deflector angles are possible. In the following analysis, each unit having a distinctive combination of configurational and/or operational parameters (in this analysis, current ratios and deflector angles) is regarded as a "species," and the combination as depicted is termed a "chromosome." In other words, in this embodiment, the chromosome for the $j^{th}$ species comprises a distinctive combination of 12 (twelve) genes, as shown in FIG. 2. In FIG. 2, the subscript "j" indicates that the depicted "chromosome" is of the $j^{th}$ species. The number inside each parentheses corresponds to the location sequence of the deflector, from upstream to downstream. I.e., deflectors $C_1$, $C_2$, and $C_3$ are "1", "2", and "3", respectively, and deflectors $P_1$, $P_2$, and $P_3$ are "4", "5", and "6", respectively. Hence, $I_j(2)$ denotes the current ratio ("current gene") of deflector $C_2$, and $\theta_j(5)$ denotes the angle ("angle gene") of the magnetic field generated by the deflector $P_2$. (Since $I_j(1)$ is a reference standard, it is always unity.)

In this embodiment, the target design condition (system performance characteristic) is that aberration, of a beam passing in an axial direction through the lenses 1, 2 and deflectors $C_1$–$C_3$, $P_1$–$P_3$, be less than a specified value. Further with respect to this embodiment, whether a particular species has an acceptable probability of meeting the specified value is determined by an evaluation function $H_1$, expressed as follows:

$$H_1 = 1/(c + a^*Ab) \tag{1}$$

wherein aberration is denoted by Ab, c is a suitable constant inserted to prevent the function from reaching infinity, and a is an appropriately determined weighting factor to facilitate beam convergence.

Initially, the various genes $I_j(1)$ through $\theta_j(6)$ shown in the chromosome of FIG. 2 are regarded as initial conditions. Each gene is selected randomly from a practicable range; hence, the search for each combination of genes (i.e., for each respective "chromosome") can be performed over a wide design space. By way of example, consider a set of eight "initial-condition" species (j=1 through 8). For each of these species j, the respective aberration Ab generated from the respective chromosome (combination of the genes $I_j(1)$ through $\theta_j(6)$) is calculated, after which the respective values of the evaluation function $H_1$ are computed.

Of the original set (eight in this example) of species, a subset of species is selected having chromosomes that produced the higher computed values for the evaluation function $H_1$ than the species that were not selected. From this subset of species, a group of individuals are selected that are destined to become "parents." The selection is based on a selection criterion such as a probability. The probability that an individual representing a species in the subset will be selected for parenthood is proportional to the respective value of the evaluation function $H_1$ of the species of the individual. For instance, consider four species (#1, #2, #3, #4) in the subset, wherein the respective values of the evaluation function $H_1$ for the four species (#1, #2, #3, #4) are 5, 3, 2, and 1, respectively. The sum of these evaluation values is 11. Hence, the probability of an individual of any of these species becoming a parent is 5/11, 3/11, 2/11, and 1/11, respectively.

Continuing further with this example, from these four species, and according to these probabilities, eight individuals can be selected to be "male" parents, and eight individuals can be selected to be "female" parents. Each male is destined to be "mated" with a respective one of the females. (Alternatively, matings can involve more than two parents.)

From each "mating", genes contributed by the parents are recombined in the chromosome of the child species produced from the mating. For example, with child species produced from respective matings of two parents, the "value" $G_C$ of each gene in the chromosome of the child can be evaluated using the expression:

$$G_C = (H_M^* G_M + H_F^* G_F)/H_M + H_F) \tag{2}$$

wherein $G_M$ is a value of the corresponding gene from and $H_M$ is the evaluation factor of one parent, and $G_F$ is a value of the corresponding gene from and $H_F$ is the evaluation factor of the other parent. Alternatively, Expression (2) can be stated more simply:

$$G_C = (G_M + G_F)/2 \tag{3}$$

Further alternatively, both of the expressions (2), (3) can be used.

Therefore, according to the foregoing example, eight individual child species are produced, each having recombined genes. Aberrations Ab are calculated for each child species. Also, for each child species, the respective value of the evaluation function $H_1$ is calculated using Equation (1). If an individual child species has a respective value of the evaluation function $H_1$ greater than a specified threshold value (i.e., if the respective aberration Ab is less than a specified threshold value), then calculations are ceased and that particular child species (i.e., the particular combination of genes, or deflector parameters in the respective chromosome) is employed to dictate the respective combination of configurational and/or operational parameters of the deflectors. If two or more individual child species meet the threshold conditions, then the child species having the highest value of the evaluation function $H_1$ is employed to dictate the respective combination of parameters.

If, in this example, the respective values of the evaluation function $H_1$ of all eight child species are below the specified threshold value, then the four child species having higher respective values are selected. From the group of four child species, individuals are selected for further "matings." E.g., and further according to the example, eight individuals are selected from the group of four species to serve as "females," which are mated with respective "males" selected from the group. A child species from each "mating" (the child species having a respective chromosome with a respective recombined assortment of genes, some from the respective male parent and others from the respective female parent) are evaluated as described above to determine whether any of these child species has a respective value of the evaluation function $H_1$ greater than the threshold value (i.e., exhibits an aberration Ab that is less than the specified threshold for aberration). Note that this second generation of child species includes the "grandchild" species of the first group of parents.

In the example described above, four species having higher respective values of the evaluation function are selected, from a group of eight child species, to supply individuals to be parents. Alternatively, for example, individuals to be parents can be selected from all eight species. The alternative option generally yields poorer convergence compared to selecting parent individuals from a subgroup of species having higher respective values of the evaluation function, but the alternative option exhibits a reduced probability of converging on local solutions rather than obtaining the optimal solution.

In addition, in the establishment of initial conditions and the obtaining of new species according to this embodiment, if only species with high respective values of the evaluation function are selected as parents, then the child species selected for subsequent matings need not be only those having higher values.

In contrast, if all the initial-condition species and child species are used as parents, it is desirable when selecting individuals that the individuals be selected mostly from species having high respective values of the evaluation function.

Second Representative Embodiment

This embodiment is similar to the first representative embodiment up to the stage in which eight male individuals and eight corresponding female individuals are selected for matings. In this embodiment, however, rather than creating new chromosomes by randomly recombining the genes from the parents, certain genes simply are exchanged. For example, in the example described above, each male chromosome has twelve genes and each female chromosome has twelve genes. In this embodiment, certain (e.g., six genes) simply are selected at random and exchanged in the formation of the child chromosome (thus, in the stated example, the child chromosome has six genes obtained from the male-parent chromosome and the six remaining genes obtained from the female-parent chromosome). As in the first representative embodiment, eight matings between respective parents produce eight child species, one from each mating. Each child species has a chromosome containing six randomly selected genes from one parental chromosome and six randomly selected genes from the other parental chromosome. After this gene exchange in the generation of children, the process of this embodiment continues in a manner that is similar to the first representative embodiment.

Further regarding this embodiment, respective values of an appropriate evaluation function are calculated for each of the eight new child species as well as for each of the sixteen parent species, for a total of 24 species that are evaluated. Of these species, the four having higher respective values of the evaluation function can be carried forward to be the parents of the next generation, if necessary. Since the original parent species become the subjects of comparisons with their child species, the highest value, among the selected species, of the evaluation function will not be lower than the respective values of the preceding generation.

Third Representative Embodiment

In this embodiment, whenever a group of, e.g., eight new species are selected (as in the first representative embodiment), the species, in the preceding group, having the highest respective value of the evaluation function is added to make a group of nine species. The respective values of the evaluation function produced by these nine species are compared. Four species having higher respective values of the evaluation function are used to supply parents for the next generation. Hence, even if alternation of generations occurs, the highest value of the evaluation function will not be lower than the respective values of the preceding generation. Alternatively, three species (of the subsequent generation) having the highest respective values of the evaluation function can be combined with the species in the original generation having the highest values, yielding a total of four species from which individuals are selected to become parents for the next generation.

In this embodiment, gene exchange between the male and female parents is random. Consequently, the search for suitable species can be conducted over a broad design space. In situations in which the design space is still not sufficiently broad, the search space can be expanded further by causing "mutations" in certain individual genes in certain chromosomes. The concept of mutation can be applied in any of the embodiments. Mutations generally are accomplished by imparting changes to one or more genes in newly formed chromosomes. The mutations are imposed at a certain probability.

In other words, in a newly formed chromosome (produced from a mating), specific individual genes are selected for mutation. One way in which a mutation can be made is to add a specified number (which can be positive or negative) to the corresponding parametric value of the gene. Another way is to substitute the particular parametric value of the gene with another parametric value. If a parametric value created by a mutation is unsuitable, then upper and lower limits can be imposed on the range of changes that can be made by mutation. Mutations need not be made in all chromosomes. For example, chromosomes having high respective values of the evaluation function can be excluded from mutation. To ensure the exemption, individuals selected for mutation can be those remaining after excluding a specified number of individuals having high respective values of the evaluation function.

Fourth Representative Embodiment

After obtaining an optimum combination of parameters in a manner as described, for example, in any of the foregoing representative embodiments, an even better combination of parameters can be found, if desired, by employing a "hill-climbing" technique, described as follows:

With the combination of parameters ($I_j(1)$, $\theta_j(1)$, ..., $I_j(6)$, $\theta_j(6)$) described above, an optimum combination found by any of the foregoing representative embodiments, for example, are regarded as "initial" values ($I_0(1)$, $\theta_0(1)$, ..., $I_0(6)$, $\theta_0(6)$) for performing hill-climbing. First, the value for $I_0(1)$ is changed by a unit amount in the plus direction and by a unit amount in the minus direction. If either action results in an increase, for the respective chromosome, of the respective value for the evaluation function, then the value resulting from the action, $I_{01}(1)$, is used. If the respective value of the evaluation function does not increase as a result of either action, then $I_{01}(1)=I_0(1)$. Next, the value for $\theta_0(1)$ is changed by a unit amount in the plus direction and a unit amount in the minus direction. If either action results in an increase in the respective value (of the evaluation function) for the respective chromosome, then the value resulting from the action, $\theta_{01}(1)$, is used. If the respective value of the evaluation function does not increase as a result of either action, then $\theta_{01}(1)=\theta_0(1)$. This operation continues in sequence for all genes through $\theta_0(6)$.

Then, the value for $I_{01}(1)$ is changed by a unit amount in the plus direction and by a unit amount in the minus direction. If either action results in an increase of the respective value (of the evaluation function) for the respective chromosome, then the value resulting from the action, $I_{02}(1)$, is used. If the respective value of the evaluation function does not increase as a result of either action, then $I_{02}(1)=I_{01}(1)$. Next, the value for $\theta_{01}(1)$ is changed by a unit amount in the plus direction and by a unit amount in the minus direction. If either action results in an increase in the respective value (of the evaluation function) for the respective chromosome, then the value resulting from the action, $\theta_{02}(1)$, is used. If the respective value of the evaluation function does not increase as a result of either action, then $\theta_{02}(1)=\theta_{01}(1)$. This operation continues in sequence for all genes through $\theta_{01}(6)$. These sequences of steps are continued in a similar manner until the obtained respective value of the evaluation function no longer exhibits an increase from the respective action (i.e., the "hill" is fully climbed). Upon reaching the crest of the "hill" in this manner, the combination of parameters providing the highest respective values of the evaluation function is provided.

A representative disclosure of the hill-climbing technique is set forth in Chu and Munro, *Optik* 61(3):213–236 (1982). Commercially available software programs are available and can be used.

Fifth Representative Embodiment

Figure 3:
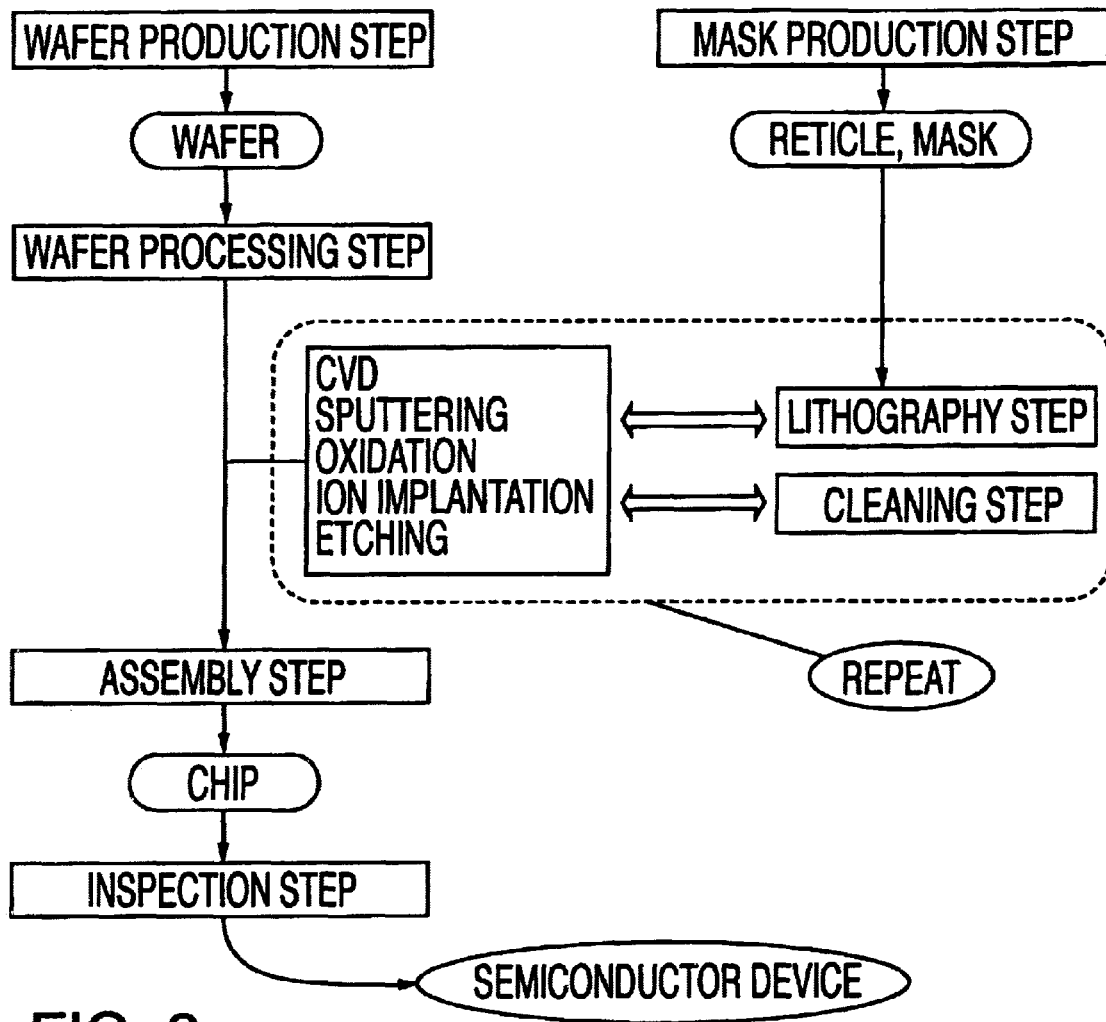
FIG. 3 is a flow chart of steps in a process for performing for manufacturing a microelectronic device, as described in the fifth representative embodiment, wherein the process includes a microlithography method according to the invention.

FIG. 3 is a flow chart of an exemplary microelectronic-device fabrication method to which apparatus and methods according to the invention can be applied readily. The fabrication method generally comprises the main steps of wafer production (wafer preparation), wafer processing, device assembly, and device inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry etching) to etch the thin film or substrate according to the resist pattern; (5) doping as required to implant ions or impurities into the thin film or substrate according to resist pattern; (6) resist stripping to remove the remaining resist from the wafer; and (7) wafer inspection. Wafer processing is repeated as required (typically many times) to fabricate the desired microelectronic devices on the wafer.

Figure 4:
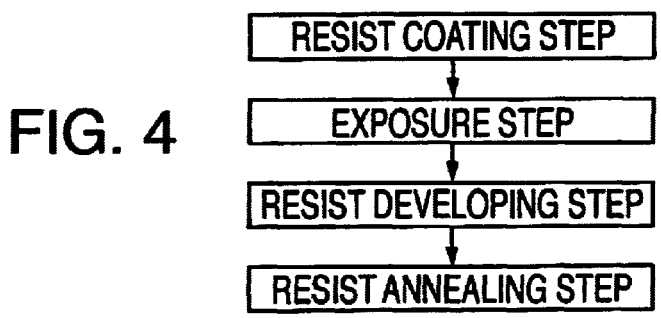
FIG. 4 is a flow chart for performing microlithography.
Figure 5:
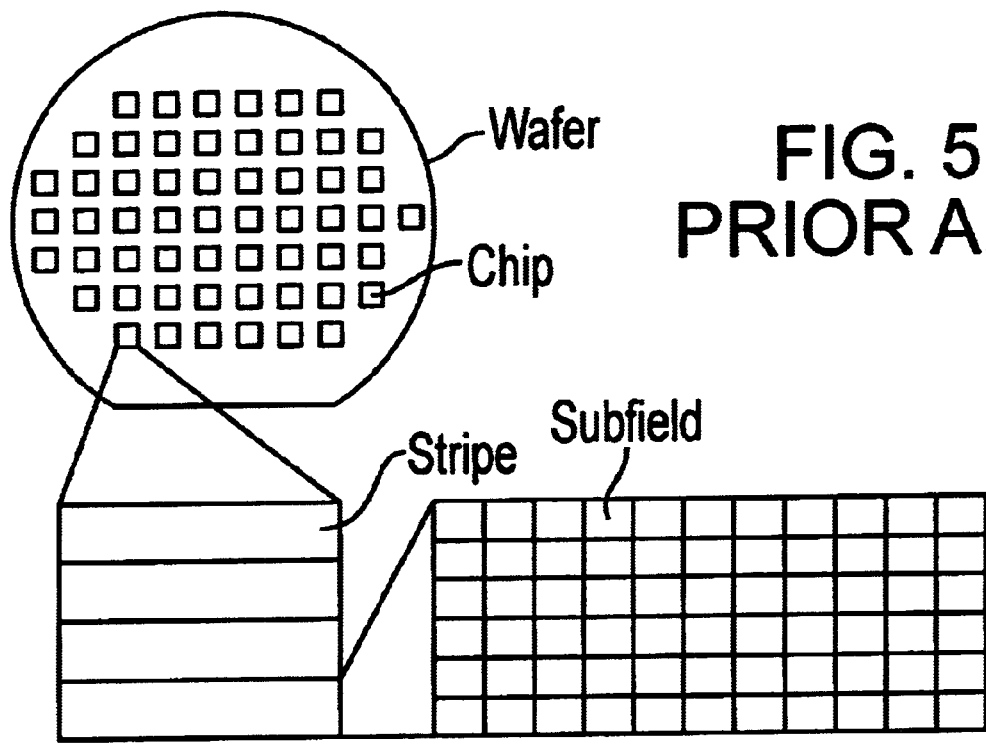
FIG. 5 schematically depicts certain aspects of a conventional divided-reticle projection-microlithography performed using a charged particle beam.
Figure 6:
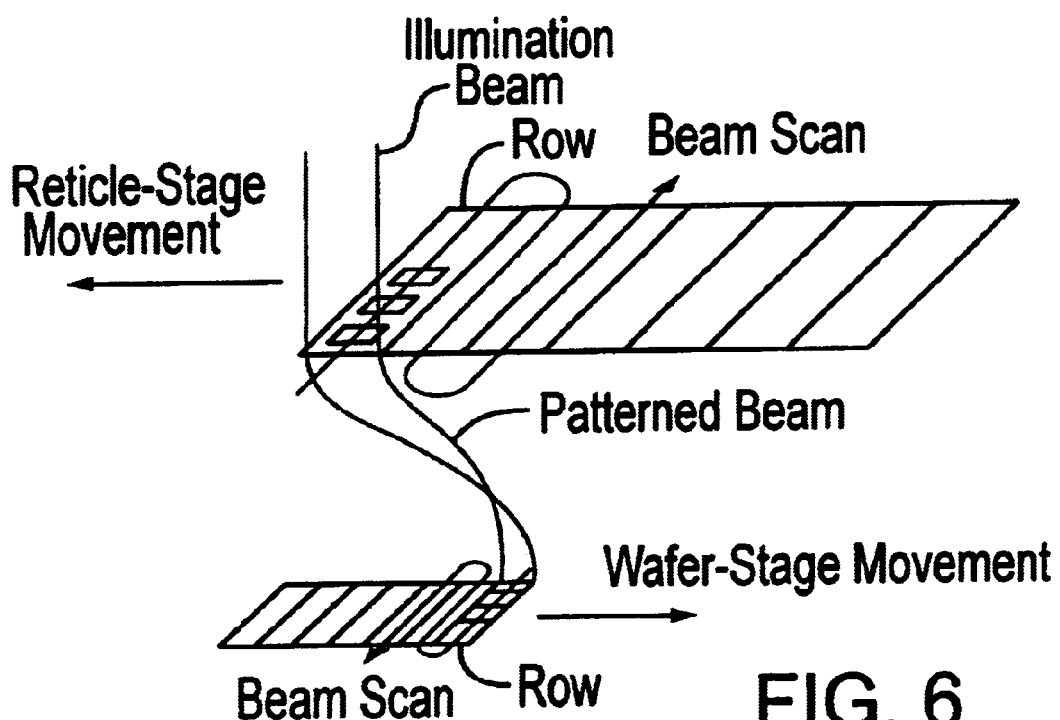
FIG. 6 schematically depicts an actual microlithographic projection-exposure being made, according to conventional practice, using a divided reticle and a charged particle beam.

FIG. 4 provides a flow chart of typical steps performed in microlithography, which is a principal step in wafer processing. The microlithography step typically includes: (1) resist-application step, wherein a suitable resist is coated on the wafer substrate (which can include a circuit element formed in a previous wafer-processing step); (2) exposure step, to expose the resist with the desired pattern; (3) resist-development step, to develop the exposed resist to produce the imprinted image; and (4) optional resist-annealing step, to enhance the durability of the resist pattern.

The general process steps summarized above are all well-known in the art.

EXAMPLE 1

This example is directed to a specific configuration of the system depicted generally in FIG. 1. The deflectors $C_1$–$C_3$ and $P_1$–$P_3$ used in the system are configured using a method according to the invention. The three deflectors $C_1$–$C_3$ are situated upstream of the aperture 5, and the three deflectors $P_1$–$P_3$ are situated downstream of the aperture 5, as shown in FIG. 1. Each species considered in the method comprises twelve genes each, wherein each gene pertains to a respective current ratio or field angle of a respective deflector. The current value of the first deflector is used as a reference standard; hence, its value was always unity.

In this example the axial length of the column is 660 mm. The axial distance between the beam-shaping aperture 3 and the aperture 5 is 330 mm, and the axial distance between the aperture 5 and the reticle 4 is 330 mm. With respect to each of the lenses 1, 2, the inside diameter is 75 mm, the coil outside diameter is 128 mm, the thickness of each pole piece is 10 mm, the axial length is 78 mm, and the center positions along the optical axis are 165 mm and 495 mm from the beam-shaping aperture 3, respectively. (The plane of the beam-shaping aperture 3 is regarded as axial "0", with the beam propagating in the downstream direction from the beam-shaping aperture 3.) The beam-acceleration voltage is 100 keV. The subfield size is 1-mm square on the reticle 4 and 250-$\mu$m square as projected onto the wafer, and the transverse beam size is 1 mm$^2$. The aperture angle of the electron beam at the reticle 4 is 1.5 mrad.

With respect to each of the deflectors $C_1$–$C_3$, $P_1$–$P_3$, the inside diameter is 35 mm, the outside diameter is 50 mm, and the axial length is 68 mm. In each deflector, coil angles of 12°, 60°, and 72° are used. The axial distances from the beam-shaping aperture 3 are 108 mm for $C_1$, 183 mm for $C_2$, 258 mm for $C_3$, 400 mm for $P_1$, 475 mm for $P_2$, and 550 mm for $P_3$. The beam is guided by the depicted configuration to have a deflection vector of (12.35, 2.1). With such a deflection vector, the electron beam emitted upstream at the system axis (Z-axis) reaches a location 12.35 mm along the X-axis and 2.1 mm along the Y-axis at the reticle surface.

In this example, 60 species (first generation) were selected as initial values. The respective parametric values of the genes that constituted the chromosome of each species in the first generation were selected randomly from a practical range of values. As an evaluation function $H_2$, the equation:

$$H_2 = 1/(10^{-5} + \alpha_a) \qquad (4)$$

was used, wherein $\alpha_a$ is the exit angle of the beam from the beam-shaping aperture 3. The unit of exit angle $\alpha_a$ from the beam-shaping aperture is ° (degrees). Using Expression (4), a respective value of this evaluation function was calculated for each of the 60 species in the first generation. The species having the highest value of the evaluation function was carried forward unconditionally to the next (second) generation. Of the remaining species in the first generation, one individual was selected to be a male parent and one individual was selected to be a female parent according to probabilities proportional to their respective values of the evaluation function. The genes from the parents were mixed according to Expression (2), above, to generate a species (one individual) in a second generation having a new combination of genes relative to the parents. This same procedure for producing a new species (individual) was performed 59 times (each time with different parents) to produce a second-generation population of 60 species from the 59 newly created child species and the one species that was carried forward.

In the second-generation population, random numbers from 0 to 1 were assigned to each of the 60 species. The respective current ratios (I) and field angles (θ) of the upper three deflectors ($C_1$–$C_3$) were mutated in those species having assigned numbers of 0.12 or less and in those species having assigned numbers of 0.88 or greater. To effect the mutation in each of these species, a random value between −0.5 and 0.5 was added to the respective current ratio, and a random value between −5 and 5 was added to the respective field angle.

At this stage in the process, the respective parameters of the lower three deflectors $P_1$–$P_3$ were not mutated because the parameters of these deflectors make virtually no contribution to the particular evaluation function $H_2$ employed.

Considering these 60 second-generation species as parental candidates for producing a subsequent generation, the respective value of the evaluation function $H_2$ was calculated for each of the 60 second-generation species. The species having the highest respective value of the evaluation function was identified for carrying forward. Of the remaining 59 parental candidates, 59 "matings" were performed (each time with different parents) to produce a population of 60 species from the 59 newly created child species and the one species (individual) that was carried forward. The child species were evaluated as described above, and the selection and mating process repeated another 29 times. The 60 child species produced by the 30th mating were evaluated according to the function:

$$H_3 = 1/(1 + d + b) \qquad (5)$$

wherein d is distortion (in μm) at the subfield level, and b is beam blur (in μm). Then, another 30 generational iterations were performed, each involving selection (according to respective values of the evaluation function $H_3$) and mating as described above. In this second series of 30 iterations, when performing each of the 30 generational iterations described above, a random number from 0 to 1 was assigned to each of the 60 species produced in each mating. Respective current ratios and field angles of the lower three deflectors $P_1$–$P_3$ were mutated in those species having an assigned number of 0.15 or less and of 0.85 or greater. Mutations were effected by adding a random value between −0.5 and 0.5 to each of the respective current ratio and the field angle.

Mutation and gene recombination were stopped at the 30th iteration. Of the child species produced from each iteration, the respective values of the evaluation function were calculated (using the $H_3$ function) and the species having the highest respective value of the evaluation function was selected for carrying forward. Meanwhile, in these iterations, the parameters of the upper three deflectors $C_1$–$C_3$ were not mutated to prevent mutation-based deterioration of the values, of the evaluation function, from the prior stage of iterations (nearly optimal solutions should have been obtained in the prior stage of iterations).

Then, using the evaluation function:

$$H_4 = 1/(10^{-5} + \alpha_r) \qquad (6)$$

wherein αr is the angle of incidence of the beam to the reticle, respective values of the evaluation function were determined for selected species produced by the last iteration. The current ratio and field angle (in degrees) of the species having the highest respective values of the evaluation function were determined for the sixth deflector $P_3$ (the detector closest to the reticle) using the hill-climbing technique. As a result, optimal values such as the data shown in Table 1, below, were obtained.

TABLE 1

|  | Current Ratio | Field Angle |
| --- | --- | --- |
| Deflector 1 | 1.00000 | −92.68000° |
| Deflector 2 | −0.60810 | −68.73601° |
| Deflector 3 | −1.16774 | −45.37404° |
| Deflector 4 | 2.92347 | −109.09496° |
| Deflector 5 | 2.20169 | −93.01785° |
| Deflector 6 | −2.82387 | −134.73484° |

Next, for every possible combination of parameters, ranges were determined that yielded satisfaction of all the following conditions:

(1) exit angle of the beam from the beam-shaping aperture being ≦1 mrad;

(2) angle of incidence of the beam to the reticle being ≦0.125 mrad;

(3) blur being ≦1 μm; and (4) distortion in the subfield being ≦5 μm.

In view of the above-listed values, the current ratios, field angles, and deflector positions were set as appropriate. Then, the beam-acceleration voltage was set to 15 keV, the subfield size was increased to 1.2-mm square, the aperture angle of the beam at the reticle was increased to 1.8 mrad, the lens column length was increased to 561 mm, the coil inside diameter of each deflector $C_1$–$C_3$ and $P_1$–$P_3$ was set between 34.2 mm and 37.4 mm, the coil outside diameter was set between 47.6 mm and 58.2 mm, and the length along the optical axis was set between 66.4 mm and 71.2 mm. After these changes, data in the ranges set forth in Table 2 were obtained. (The units for current ratio and field angle are percents (%) of the respective data listed in Table 1, and for position is distance in mm from the surface of the beam-shaping aperture.)

TABLE 2

| | Current Ratio | | Field Angle | | Position | |
|---|---|---|---|---|---|---|
| | Minimum | Maximum | Minimum | Maximum | Minimum | Maximum |
| Deflector 1 | −2.951 | 2.530 | −4.244 | 16.892 | 95 | 111 |
| Deflector 2 | −5.887 | 5.183 | −14.841 | 3.765 | 180 | 190 |
| Deflector 3 | −5.944 | 4.762 | −7.644 | 2.389 | 255 | 263 |
| Deflector 4 | −0.346 | 0.349 | −9.701 | 9.767 | 399.8 | 400.2 |
| Deflector 5 | −0.242 | 0.244 | −0.769 | 0.776 | 474.8 | 475.2 |
| Deflector 6 | −0.151 | 0.154 | −0.368 | 0.371 | 549.7 | 550.3 |

The "exit angle of the beam from the beam-shaping aperture" refers to an angle formed between the on-axis deflection path directed away from the system axis (also the axis of the beam-shaping aperture) and the system axis. The "angle of incidence of the beam to the reticle" refers to the angle formed between the on-axis deflection path and a line parallel with the system axis, passing through the point of incidence at the reticle surface. The "aperture angle of the beam at the reticle" refers to the angle formed between the path of the beam exiting in the (1, 0) direction from the system axis (i.e., the convergence path ($W_a$ path)) and the system axis at the reticle surface. The "length of the lens column" refers to the axial distance from the beam-shaping aperture to the reticle.

EXAMPLE 2

This example was performed presupposing the same conditions as described in Example 1. Optimal values of deflector parameters were found by the same method as described in Example 1. However, in place of Expression (5) used in Example 1, the following evaluation function was used:

$$H_5 = 1/(1 + |4.9 - d| 0.9 - b|) \quad (7)$$

As a result, the following data were obtained as the optimum combination of values of deflector parameters:

TABLE 3

| | Current Ratio | Field Angle |
|---|---|---|
| Deflector 1 | 1.00000 | −78.83272° |
| Deflector 2 | −0.60810 | −54.88852° |
| Deflector 3 | −1.16775 | −31.52713° |
| Deflector 4 | 2.39817 | −82.87136° |
| Deflector 5 | 0.41115 | −131.91370° |
| Deflector 6 | −1.28801 | −137.33486° |

Next, for every possible combination of parameters, ranges were determined that yielded satisfaction of all the following conditions:
  (a) exit angle of the beam from the beam-shaping aperture being ≦1 mrad;
  (b) angle of incidence of the beam to the reticle being ≦0.125 mrad;
  (c) blur being ≦1 μm; and
  (d) distortion in the subfield being ≦5 μm.

In view of the above-listed data, the current ratios, field angles, and deflector positions were set as appropriate. Then, the beam-acceleration voltage was increased to 15 keV, the subfield size was increased to 1.8-mm square, the aperture angle of the beam at the reticle was increased to 2.5 mrad, the lens-column length was increased to 528 mm, the coil inside diameter of each deflector was increased to between 34.2 mm and 38.2 mm, the coil outside diameter of each deflector was increased to between 46.8 mm and 58.2 mm, and the coil length along the optical axis was increased to 66.4 mm and 71.2 mm. After making these changes, data in the ranges set forth in Table 4 were obtained. (The units for current ratio and field angle are percents (%) of the respective data listed in Table 3, and for position is distance in mm from the surface of the beam-shaping aperture.)

TABLE 4

| | Current Ratio | | Field Angle | | Position | |
|---|---|---|---|---|---|---|
| | Minimum | Maximum | Minimum | Maximum | Minimum | Maximum |
| Deflector 1 | −1.465 | 1.226 | −1.481 | 11.746 | 99 | 109 |
| Deflector 2 | −2.892 | 2.554 | −10.303 | 1.313 | 182 | 190 |
| Deflector 3 | −2.990 | 2.296 | −4.712 | 0.828 | 257 | 260 |
| Deflector 4 | −0.260 | 0.268 | −1.062 | 1.036 | 399.9 | 400.1 |
| Deflector 5 | −0.807 | 0.821 | −1.385 | 1.330 | 474 | 475.9 |
| Deflector 6 | −0.206 | 0.211 | −0.294 | 0.304 | 549.6 | 550.4 |

Deflector-design parameters found in Examples 1 and 2, as well as by a conventional method ("Comparison Example") are listed in Table 5, below. The current ratios for all deflectors are normalized to a unity.

TABLE 5

| | Example 1 | Example 2 | Comparison Example |
|---|---|---|---|
| Exit angle from shaping aperture (°) | 0.0347 | 0.0447 | 0.0000 |
| Angle of incidence to reticle (°) | 0.0001 | 0.0001 | 0.0005 |
| Blur (μm) | 0.8188 | 0.5082 | 0.2779 |
| Distortion in subfield (μm) | 1.1623 | 1.5031 | 1.3579 |
| Deflector current ratio | | | |
| C1 | 1 | 1 | 1 |
| C2 | −0.60810 | −0.60810 | 0.00192 |
| C3 | −1.16774 | −1.16775 | −2.29609 |
| P1 | 2.92347 | 2.39817 | −1.11466 |
| P2 | 2.20169 | 0.41115 | −0.06875 |
| P3 | −2.82387 | −1.28801 | 0.46327 |
| Deflector angle (°) | | | |
| C1 | −92.68000 | −78.83272 | −69.7863 |
| C2 | −68.73601 | −54.88852 | −16.3763 |
| C3 | −45.37404 | −31.52713 | −25.1174 |
| P1 | −109.09496 | −82.87136 | 105.3389 |
| P2 | −93.01785 | −131.91370 | 169.7562 |
| P3 | −134.73484 | −137.33486 | 64.9586 |
| Power (W) | | | |
| C1 | 5.0 | 12.7 | 10.6 |
| C2 | 1.8 | 4.7 | 0.0 |
| C3 | 6.8 | 17.3 | 55.7 |
| P1 | 42.4 | 72.8 | 98.2 |
| P2 | 24.1 | 2.1 | 0.4 |
| P3 | 39.6 | 21.0 | 17.0 |
| Total power (W) | 119.7 | 130.6 | 181.9 |

From a comparison of the data of Example 1 with corresponding data for the Comparison Example, it can be discerned that the exit angle of the beam from the beam-shaping aperture as well as blur are slightly better in the Comparison Example, but the respective values in Example 1 for these parameters still fall within acceptable tolerances. But, it also can be seen that power (maximum local power)

is reduced in Example 1 by approximately 57% relative to the Comparison Example, and overall power is reduced in Example 1 by approximately 34% relative to the Comparison Example.

Similarly, in Table 5, comparing the data of Example 2 with the Comparison Example, it can be discerned that the exit angle of the beam from the beam-shaping aperture, as well as blur and distortion at the subfield are all slightly better in the Comparison Example. However, the respective values for these parameters in Example 2 fall within acceptable tolerances. Furthermore, maximum local power is reduced in Example 2 by approximately 26% relative to the Comparison Example, and overall power is reduced in Example 2 by approximately 28% relative to the Comparison Example.

As described above, evaluation of a wide range of species over a design field now is possible, while preventing convergence to a local solution (rather than to an optimal solution) and facilitating an efficient determination of the optimal solution. Also, since initial values can be selected freely, experience and training are not required to select them. Other benefits and advantages include:

(1) There is an increased possibility that species having high respective values of an evaluation function will be "crossed," thereby increasing the probability of producing species having even higher respective values of the evaluation function in the next generation.

(2) It is easy to select species giving priority to those with high respective values of the evaluation function.

(3) Alternation of generations can be prevented by unconditionally carrying forward only a specified number of parents having high respective values of the evaluation function from among the newly created population.

(4) The effects of genes (parameters) having higher respective values of the evaluation function can be left largely intact, thereby increasing the probability that species having high respective values of the evaluation function will be produced.

(5) The search space is expanded, making it possible to minimize the possibility of convergence on a local solution.

(6) Replacement of species having high respective values of the evaluation function with species having low respective values as the result of mutation can be prevented.

(7) Whenever there are multiple target values it is possible to conduct searches so that the various values fall within the target values.

(8) Convergence on local solutions can be prevented and even more optimum parameters can be found.

(9) Distortion and blur can be minimized, allowing patterns with ultra-fine linewidths to be exposed and transferred accurately.

(10) Conditions in which the angle of incidence of the beam to the reticle is $\leq 0.125$ mrad, blur is $\leq 1$ μm, and distortion in the subfield is $\leq 5$ μm all can be met under given conditions and where the exit angle of the beam from the beam-shaping aperture is in the range of $\leq 1$ mrad.

Whereas the invention has been described in connection with multiple representative embodiments and examples, it will be apparent that the invention is not limited to those embodiments and examples. On the contrary, the invention is intended to encompass all modifications, alternatives, and equivalents as may be included within the spirit and scope of the invention, as defined by the appended claims.

What is claimed is:

1. A method, based on a genetic algorithm, for optimizing parameters of an optical system used in a charged-particle-beam (CPB) optical system, the method comprising:

(a) regarding each respective value of a respective parameter as a respective gene;

(b) regarding each respective combination of values of the parameters as a respective chromosome and each respective configuration of the CPB optical system according to the respective chromosome as a respective species;

(c) each parameter having a respective initial-condition gene, wherein each of $N_A$ species in a group A comprises a respective chromosome of the initial-condition genes;

(d) defining an evaluation function, wherein values of the evaluation function are related to respective qualities of a performance characteristic of the CPB optical system, and establishing a threshold value for the evaluation function;

(e) from the group-A species, selecting a group B including $N_B$ species (wherein $N_B \leq N_A$) in which the constituent species have higher respective values of the evaluation function than species not selected to be in the group B;

(f) from the group-B species, and based on a selection criterion, selecting groups $C_{ND}$, in which each group includes $N_C$ individuals, to produce a group D including $N_D$ species, wherein each species in group D comprises a respective chromosome produced by recombination of one or more genes from respective chromosomes of species in the group $C_{ND}$;

(g) producing the group D of $N_D$ species from the groups $C_{ND}$;

(h) from the group D, selecting a new group B including $N_B$ species;

(i) repeating steps (e)–(h) a predetermined number of times or until a species is produced in group D having a respective value of the evaluation function that exceeds the threshold; and (j) employing the species produced in step (i) to define the respective combination of values of the parameters for configuring the components or for operating the components in the coordinated manner.

2. The method of claim 1, wherein, in step (f), the group $C_{ND}$ of individuals is selected in a manner such that species having higher respective values of the evaluation function have a higher probability of being selected.

3. The method of claim 2, wherein, for a given species, the respective probability is expressed as a ratio of the respective value of the evaluation function to a sum of respective values of the evaluation function among the species $N_B$ of group B.

4. The method of claim 1, further comprising the step of substituting a specified number $N_E$ (wherein $N_E < N_D$) of species, having lower respective values of the evaluation function, in the group D with the specified number $N_E$ of species, having higher respective values of the evaluation function, in the group B.

5. The method of claim 1, further comprising the step of forming a group (D+F) of species by adding a specified number $N_F$ of species, having higher respective values of the evaluation function, in the group B to the species in group D, wherein, in step (h), the (D+F) group is substituted for the group A.

6. The method of claim 1, wherein, in step (f), the genes are recombined according to a weighted average of respective values, of the evaluation function, of the genes.

7. The method of claim 1, further comprising the step, after step (j), of executing a hill-climbing technique on the determined respective values of at least some of the parameters to obtain a combination of respective values of the parameters having an optimal respective value of the evaluation function.

8. The method of claim 1, wherein step (f) further comprises changing the genes in the respective chromosomes of at least some of the species $N_D$ in group D by respective specified values randomly selected from a group of values within a specified range, or to respective values randomly selected from a group of values within a specified range.

9. The method of claim 8, wherein, in step (f), the group of species having respective chromosomes containing genes tat are recombined into chromosomes of species in group D is reduced, before the recombining of genes, by excluding species having higher respective values of the evaluation function.

10. The method of claim 1, further comprising the steps, between steps (i) and (j) of:
defining a second evaluation function, wherein values of the second evaluation function are related to respective qualities of a performance characteristic of the CPB optical system, and establishing a threshold value forte second evaluation function; and
repeating steps (e)–(h) a predetermined number of times or until a species is produced in group D having a respective value of the second evaluation function that exceeds the threshold for the second evaluation function.

11. The method of claim 10, further comprising the step, after the final step, of executing a hill-climbing technique on the determined respective values of at least some of the parameters to obtain a combination of respective values of the parameters having a maximal respective value of the evaluation function.

12. A charged-particle-beam (CPB) optical system, comprising multiple components of which respective parameters have respective values configured according to a method as recited in claim 1.

13. A charged-particle-beam (CPB) microlithography apparatus, comprising the CPB optical system of claim 12.

14. A divided-reticle charged-particle-beam (CPB) projection-microlithography apparatus, comprising:
(a) a CPB optical system configured (i) to impart an acceleration voltage of at least 15 keV to a charged particle beam passing through the CPB optical system, (ii) to illuminate a reticle subfield no larger than 1.2-mm square, (iii) to provide an aperture angle of the charged particle beam of no more than 1.8 mrad at the reticle, and (iv) with a lens-column length of at least 561 mm;
(b) the CPB optical system comprising a beam-shaping aperture and six deflectors, each deflector having a coil inside diameter of 34.2 mm to 37.4 mm, a coil outside diameter of 47.6 mm to 58.2 mm, an axial length of 66.4 mm to 71.2 mm, and coil angles of 12°, 60°, and 72°;
(c) the deflectors being energizable with respective electrical currents to produce respective magnetic fields directed at the charged particle beam passing through the respective deflectors; and
(d) respective axial positions of the deflectors and respective magnetic field angles produced by the deflectors being within respective ranges listed in Table 2, relative to respective standard values listed in Table 1, wherein (i) the respective current ratios and field angles listed in Table 1 are as optimized for the CPB optical system by analysis, using a genetic algorithm, of evaluation functions $H_2=1/(10^{-5}+\alpha_a)$, $H_3=1/(1+d+b)$, and $H_4=1/(10^{-5}+\alpha_r)$, in which $\alpha_a$ is angle of incidence of the beam at the beam-shaping aperture, $\alpha_r$ is angle of incidence of the beam at the reticle, d is distortion in $\mu$m at a subfield level, and b is beam blur in $\mu$m, (ii) the current ratios and magnetic field angles listed in Table 2 are respective percents of corresponding values listed in Table 1, (iii) axial positions are in mm units along a CPB-optical-system axis, and (iv) the axial position of the beam-shaping aperture is zero from which a charged particle beam propagates in a positive direction.

15. A divided-reticle charged-particle-beam (CPB) projection-microlithography apparatus, comprising:
(a) a CPB optical system configured (i) to impart an acceleration voltage of at least 15 keV to a charged particle beam passing through the CPB optical system, (ii) to illuminate a reticle subfield no larger than 1.8-mm square, (iii) to provide an aperture angle of the charged particle beam of no more than 2.5 mrad at the reticle, and (iv) with a lens-column length of at least 528 mm;
(b) the CPB optical system comprising a beam-shaping aperture and six deflectors, each deflector having a coil inside diameter of 34.2 mm to 38.2 mm, a coil outside diameter of 46.8 mm to 58.2 mm, an axial length of 66.4 mm to 71.2 mm, and coil angles of 12°, 60°, and 72°;
(c) the deflectors being energizable with respective electrical currents to produce respective magnetic fields directed at the charged particle beam passing through the respective deflectors; and
(d) respective axial positions of the deflectors and respective magnetic field angles produced by the deflectors being within respective ranges listed in Table 4, relative to respective standard values listed in Table 3 wherein (i) the respective current ratios and field angles listed in Table 3 are as optimized for the CPB optical system by analysis, using a genetic algorithm, of evaluation functions $H_2=1/(10^{-5}+\alpha_a)$, $H_4=1/(10^{-5}+\alpha_r)$ and $H_5=1/(1+|4.9-d|+|0.9-b|)$, in which a is angle of incidence of the beam at the beam-shaping aperture, $\alpha_r$ is angle of incidence of the beam at the reticle, d is distortion in $\mu$m at a subfield level, and b is beam blur in $\mu$m, (ii) the current ratios and magnetic field angles listed in Table 4 are respective percents of corresponding values listed in Table 3, (iii) axial positions are in mm units along a CPB-optical-system axis, and (iv) the axial position of the beam-shaping aperture is zero from which a charged particle beam propagates in a positive direction.

16. A microelectronic-device fabrication process, comprising the steps of:
(a) preparing a wafer;
(b) processing the wafer; and
(c) assembling devices formed on the wafer during steps (a) and (b), wherein step (b) comprises the steps of (i) applying a resist to the wafer; (ii) exposing the resist and (iii) developing the resist; and step (iii) comprises providing a CPB microlithography apparatus as recited in claim 13, and using the CPB microlithography apparatus to expose the resist with the pattern defined on the reticle.

17. A microelectronic-device fabrication process, comprising the steps of:

(a) preparing a wafer;
(b) processing the wafer; and
(c) assembling devices formed on the wafer during steps (a) and (b), wherein step (b) comprises the steps of (i) applying a resist to the wafer; (ii) exposing the resist and (iii) developing the resist; and step (iii) comprises providing a CPB projection-microlithography apparatus as recited in claim 14, and using the CPB projection-microlithography apparatus to expose the resist with the pattern defined on the reticle.

18. A microelectronic-device fabrication process, comprising the steps of:

(a) preparing a wafer;
(b) processing the wafer; and
(c) assembling devices formed on the wafer during steps (a) and (b), wherein step (b) comprises the steps of (i) applying a resist to the wafer; (ii) exposing the resist; and (iii) developing the resist; and step (iii) comprises providing a CPB projection-microlithography apparatus as recited in claim 15, and using the CPB projection-microlithography apparatus to expose the resist with the pattern defined on the reticle.

* * * * *

UNITED STATES PATENT AND TRADEMARK OFFICE
CERTIFICATE OF CORRECTION

PATENT NO.    : 6,627,900 B2
DATED         : September 30, 2003
INVENTOR(S)   : Fukui It is certified that error appears in the above-identified patent and that said Letters Patent is hereby corrected as shown below:

Title page,
Item [56], References Cited, OTHER PUBLICATIONS, "Chu et al.," reference, "electron performance" should be -- electron optical performance --.

Column 3,
Lines 25-26, "reduced throughput" should be -- reduced, and throughput --.

Column 8,
Lines 22-23, "operated optimum" should be -- operated at optimum --.

Column 9,
Line 42, "deflector C1" should be -- deflector $C_1$ --.

Column 16,
Line 26, "wherein αr" should be -- wherein $\alpha_r$ --.

Column 21,
Line 14, "tat" should be -- that --.
Line 23, "forte" should be -- for the --.

Column 22,
Lines 3-4, "$H_4 = 1/(10^-_5 + \alpha_r)$" should be -- $H_4 = 1/(10^{-5} + \alpha_r)$ --.
Line 43, "in which a" should be -- in which $\alpha_a$ --.

Signed and Sealed this

Thirteenth Day of April, 2004

JON W. DUDAS
*Acting Director of the United States Patent and Trademark Office*